United States Patent [19]
Genesi

[11] 4,027,325
[45] May 31, 1977

[54] INTEGRATED FULL WAVE DIODE BRIDGE RECTIFIER

[75] Inventor: Robert C. Genesi, Sterling, Mass.

[73] Assignee: Sprague Electric Company, North Adams, Mass.

[22] Filed: Jan. 30, 1975

[21] Appl. No.: 545,441

[52] U.S. Cl. .................. 357/48; 307/200 A; 307/303; 357/86
[51] Int. Cl.² ........................ H01L 27/04
[58] Field of Search ........... 357/48, 86; 307/202 R, 307/303

[56] References Cited

UNITED STATES PATENTS

| | | | |
|---|---|---|---|
| 3,466,510 | 9/1969 | Mante | 357/48 |
| 3,649,887 | 3/1972 | Keller et al. | 357/48 |
| 3,878,551 | 4/1975 | Callahan, Jr. | 357/48 |
| 3,931,634 | 1/1976 | Knight | 357/48 |

Primary Examiner—William D. Larkins
Attorney, Agent, or Firm—Connolly and Hutz

[57] ABSTRACT

A full wave rectifying junction-diode bridge rectifier is formed in an integrated silicon circuit. One of the two bridge output terminals is ohmically connected to the bulk doped silicon body so that this portion of the body may serve as the ground reference plane for the entire integrated circuit, including other signal processing circuits, and these other circuits may obtain their d.c. power from the other bridge output terminal. Thus, when the bulk doped body is of P-type conductivity, two of the four bridge diodes (grounded diodes) have their anodes connected to this ground reference terminal. Each of the grounded diodes is formed in an epitaxial pocket having two concentric P-type guard rings and a N-type guard ring positioned concentrically therebetween, all of which are tied to the ground point.

3 Claims, 5 Drawing Figures

INTEGRATED FULL WAVE DIODE BRIDGE RECTIFIER

BACKGROUND OF THE INVENTION

This invention relates to an integrated circuit full wave bridge rectifier and more particularly to such a rectifier formed in a monocrystalline silicon body.

Although full wave bridge rectifier circuits employing discrete semiconductor junction diodes are well known, the incorporation of such a circuit in an integrated silicon circuit is not known. The major obstacle to so doing is the prevention of the creation of unwanted parasitic transistors when using known structures of integrated circuit diodes, particularly as it is desirable to connect one of the d.c. output terminals of the bridge circuit to a circuit ground point which point is electrically common with the bulk doped silicon body.

For example, the bulk doped body typically contains a low concentration of P-type impurities, and an epitaxial layer is grown over the surface of the body and is lightly doped with N-type impurities. Other functional circuits such as amplifiers, signal invertors, etc., are formed by known techniques in the epitaxial layer and may require a positive d.c. power supply voltage, Vcc relative to a ground point that is most conveniently connected ohmically to the P-body. Thus an integrated bridge rectifier to be integrated in a portion of the same body will have two diodes whose anodes are electrically connected to the P-body. To form these diodes, each in a pocket of the epitaxial layer, it would be standard practice to create a P-type region in the pocket and make ohmic contact to the pocket and the P-type region. The pocket is normally defined and isolated by diffusing and driving P-type impurities about the pocket in the form of an isolation wall and making ohmic ground connection to the wall and in this case the P-type anode region of the diode. However, the surrounding epitaxial material acts as a collector of a parasitic NPN transistor, the wall acting as its base and the epitaxial pocket as its emitter. During periods when the diode is forward biased, very large currents are injected into the external epitaxial regions that tend to reduce the rectifier efficiency to very small levels and in fact tend to destroy the metallized contact to the cathode.

It is therefore an object of this invention to provide an integrated full wave bridge rectifier in a silicon body that may serve as a d.c. power supply for other circuits integrated in the same body.

It is a further object of the invention to provide an integrated full wave bridge circuit having good efficiencies and having only minor parasitic currents.

SUMMARY OF THE INVENTION

A full wave junction-diode bridge rectifier is formed in an integrated silicon circuit. One of the two bridge output terminals is ohmically connected to the bulk doped silicon body so that this portion of the body may serve as the ground reference plane for the entire integrated circuit, including other signal processing circuits, and these other circuits may obtain their d.c. power from the other bridge output terminal. Thus, when the bulk doped body is of P-type conductivity, two of the four bridge diodes (grounded diodes) have their anodes connected to this ground reference terminal. The grounded diodes are each formed in an epitaxial pocket being surrounded and defined by an annular isolation wall of P-type conductivity. A second isolation wall of P-type conductivity is spaced from and surrounds the first P-type isolation wall including therebetween an annular epitaxial region wherein a heavily doped annular and coaxial guard ring of N-type conductivity is formed. The P-type walls, the guard ring and the anode of the grounded diodes are all connected to the ground terminal.

The other two diodes (floating diodes) are each formed in an epitaxial portion that is surrounded and defined by a P-type isolation wall. This wall is also connected to the ground terminal. The floating diodes may also each include in their epitaxial portions a heavily doped annular guard ring of N-type conductivity being essentially concentric within the isolation wall and being connected to the ground terminal. Also included may be a buried layer of N-type conductivity that lies at the interface between the bulk doped body and the epitaxial portion, extending so as to overlap or at least abut the guard ring and thus create a N-type barrier in the silicon about the floating junction diode. These particular structures of grounded and floating diodes are compatibly combined in the bridge circuit of this invention, providing an integrated circuit a.c. to d.c. power supply having only small associated parasitic transistor currents and good efficiency.

DESCRIPTION OF THE PREFERRED EMBODIMENT

Figure 1:
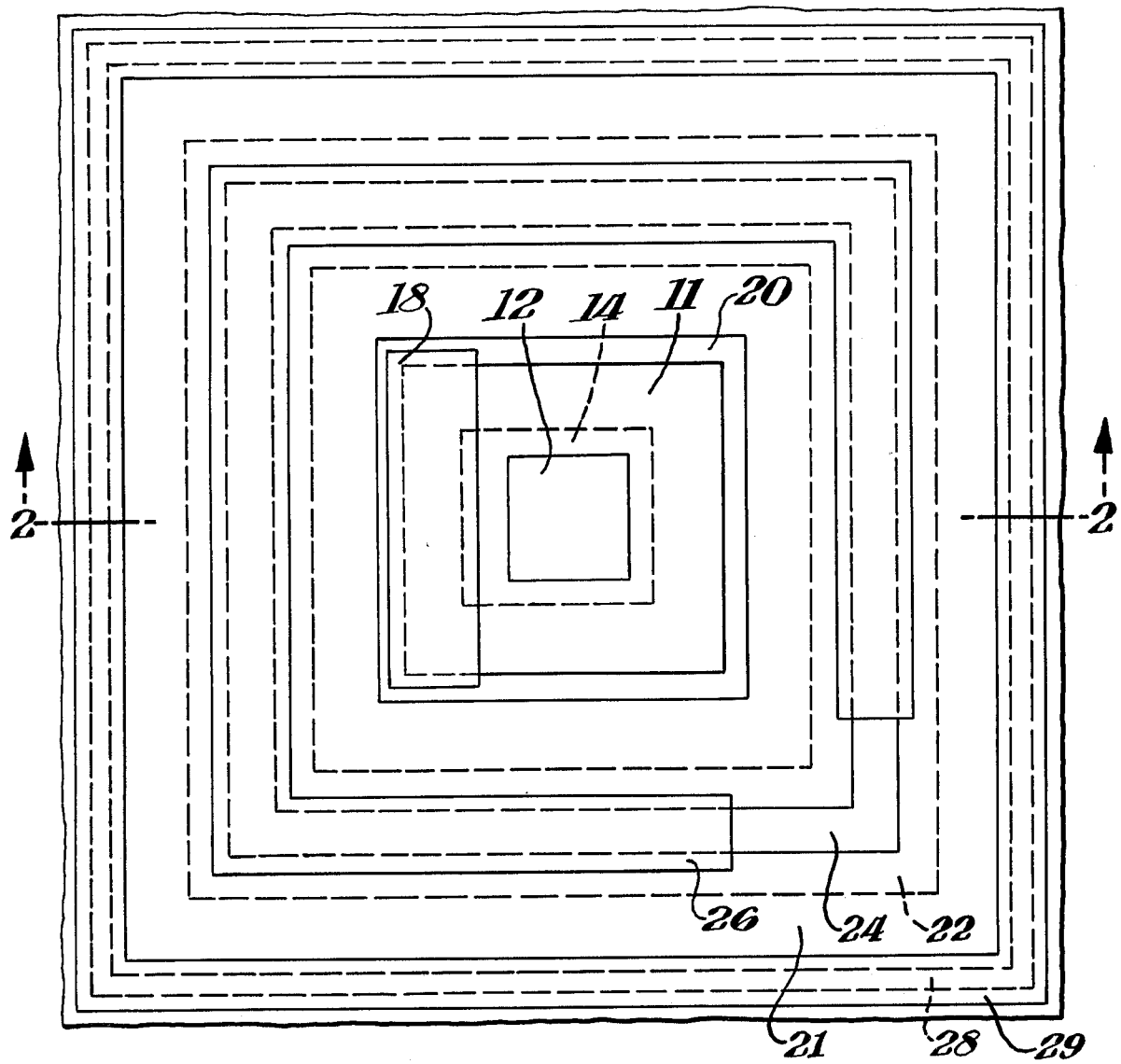
In FIG. 1 is shown a top view of a "grounded" diode of this invention, the metal contacts and protective oxide coating having been omitted for clarity.
Figure 2:
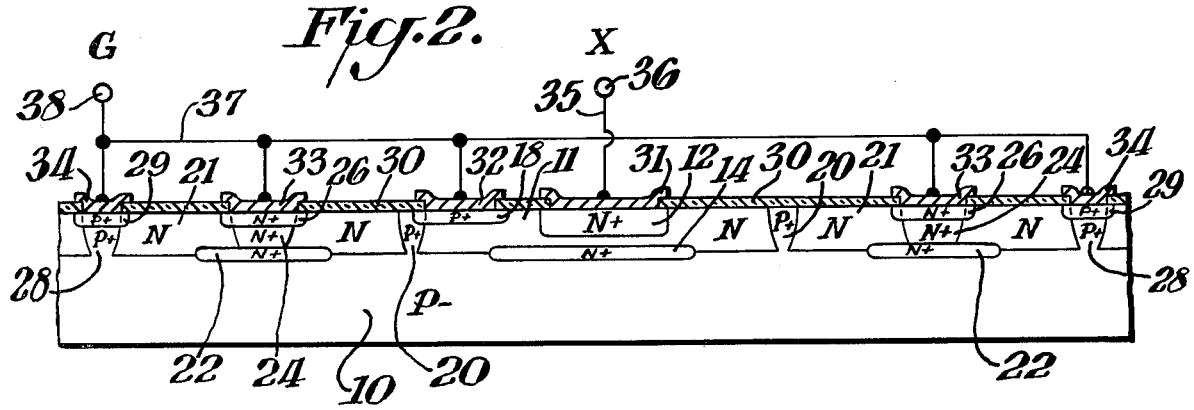
In FIG. 2 is shown a side sectional view taken in plane 2—2 of the diode of FIG. 1 but including the metal contacts and the protective oxide coating.
Figure 5:
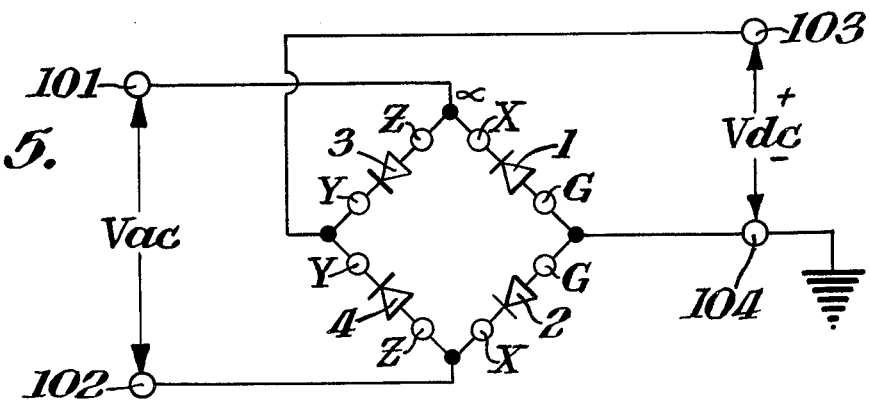
In FIG. 5 is shown schematically the integrated circuit full wave bridge of this invention employing two "grounded" diodes and two "floating" diodes.

A full wave bridge comprises four integrated diodes each formed in separate regions of an epitaxial layer that is grown over a monocrystalline silicon substrate. As shown in the schematic of FIG. 5, two of the diodes, 1 and 2, each have a structure as shown in FIGS. 1 and 2. Diodes 1 and 2 have their anodes electrically connected to a "ground" terminal 104, that will be understood in the following description to be electrically common with the bulk doped silicon substrate body.

The other two diodes, 3 and 4, in the full wave bridge circuit are ungrounded or "floating" and have their cathodes connected together and to terminal 103. Terminals 103 and 104 serve as the d.c. voltage output terminals of the bridge circuit. The cathodes of diodes 1 and 2 are connected to the anodes of diodes 3 and 4, respectively, and are further connected to input terminals 101 and 102, respectively. As in a conventional full wave bridge circuit, when an a.c. voltage is applied between the input terminals 101 and 102, a full wave rectified voltage appears at the output terminals 103 and 104.

In the preferred embodiment, the silicon body is bulk doped with P-type impurities and has a resistivity of about 1 ohm-centimeters. The epitaxial layer contains impurities of the N conductivity type and has a resistivity of about 3 ohm-centimeter.

The "grounded" diodes, 1 and 2, are each constructed as shown in FIGS. 1 and 2. A pocket 11 of the epitaxial layer is isolated from the surrounding epitaxial material by having a heavily doped isolation wall 20 of P-type impurities driven through the epitaxial layer. The term heavily doped as used herein and the designations P+ and N+ mean impurity concentrations of greater than $10^{18}$ atoms per cubic centimeter. In a surface portion of the pocket 11, there is a region 12 being heavily doped with N-type impurities to which a metal contact 31 is deposited, contact 31 serving as the cathode contact for the diode of FIG. 2. In another portion adjacent to the surface in pocket 11, is a region 18 being doped with P-type impurities and having an impurity concentration of about $10^{19}$ atoms per cubic centimeter. Region 18 is further extended so as to be coincident with or at least abut a portion of the isolation wall 20. A metal contact 32 is deposited over a portion of the layer region 18 and serves as the anode terminal of the diode of FIG. 2.

Immediately outside the isolation wall 20 is an annular pocket 21 of epitaxial layer material having a heavily P doped outer isolation wall 28 defining its outer perimeter. Superimposed over a shallow region of the isolation wall 28 at the surface there may be a heavily doped layer region 29 of P-type impurities. A metal contact 34 is made to the layer region 29 serving as a means for electrically grounding the outer isolation wall and lightly doped P-body.

Within the annular epitaxial pocket 21 there is a guard ring 24 formed by a heavy doping through the epitaxial layer with N-type impurities. Again another heavily doped layer region 26 of N-type impurities may be superimposed over the ring 24 at the surface and a metal contact 33 lies adjacent thereto serving as an ohmic contact means to the guard ring and subsequently the annular epitaxial pocket 21.

A heavily doped buried layer of N-type conductivity 14 may be formed by standard doping, driving and annealing techniques at a portion of the interface between the epitaxial pocket 11 and the P-body. A heavily doped buried layer of N-type conductivity 22 is formed at a portion of the interface between the annular epitaxial pocket 21 and the P-body, the layer 22 overlapping a portion of the guard ring 24. Both buried layers contain N-type impurities.

In FIG. 2 a system of "wired" connections 37 and 35 are shown in schematic form whereby a terminal 38 is connected by "wire" 37 to contacts, 32, 33 and 34. Although the use of wiring is workable, the diodes of this invention were "wired" and interconnected by means of aluminum metal layers being deposited simultaneously with the ohmic contacts such as 32, 33 and 34 and running between contacts over a silicon oxide layer 30 having been grown over the variously doped silicon body. Holes are provided in the oxide layer 30 permitting ohmic metal to semiconductor contact in selected regions. Similarly, contact 31 is connected to a terminal 36 by conductor 35. Terminal 38 is designated G and terminal 36 is designated X, indicating the grounded and the floating circuit points, respectively, in the full wave bridge circuit of FIG. 5.

Figure 3:
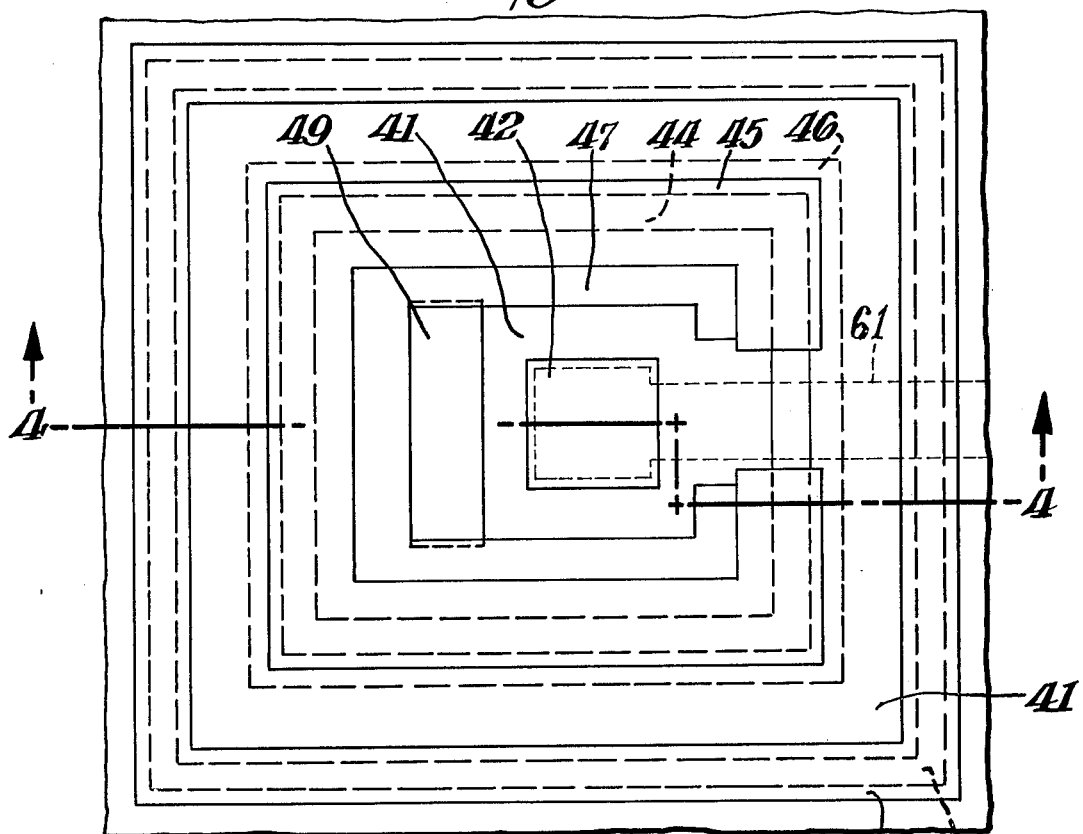
In FIG. 3 is shown a top view of a "floating" diode of this invention, the metal contacts and protective oxide coating having been omitted for clarity.
Figure 4:
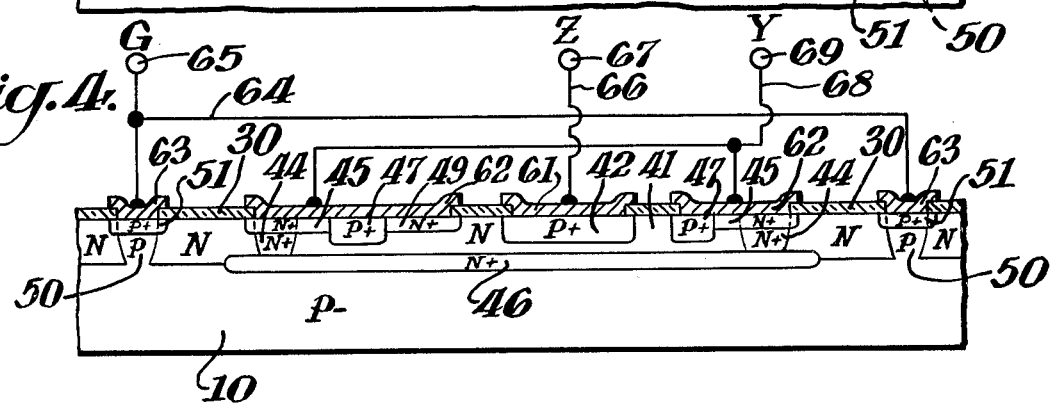
In FIG. 4 is shown a side sectional view taken in plane 4—4 of the diode of FIG. 3 including the metal contacts and the protective oxide coating.

The "floating" diodes, 3 and 4, are each constructed as shown in FIGS. 3 and 4. A pocket 41 of the epitaxial layer is isolated from the surrounding epitaxial material by having a heavily doped isolation wall 50 of P-type impurities driven through the epitaxial layer. In a surface portion of the pocket 41 there is a region 42 being heavily doped with P-type impurities having a concentration of about $10^{19}$ atoms per cubic centimeter. A metal contact 61 makes ohmic contact with the P+ region 42 and serves as the anode contact of the "floating" diode. In another surface portion of pocket 41 is a region 49 being heavily doped with N-type impurities. A metal contact 62 lies adjacent to the surface at region 49 and serves as the cathode contact for this "floating" diode. Although, as will be seen, there are other heavily N-doped regions adjacent to the epitaxial pocket 41 which are ohmically connected to cathode contact 62, the relatively close proximity of the N-type region 49 to the P-type region 42 insures that during forward conduction of the diode a major portion of the forward current flows between regions 42 and 49.

The inclusion within the epitaxial pocket 41 of a heavily doped ring 47 having P-type impurities also is thought to help concentrate the forward current in the N-type region 49. Ring shaped regions 45 and 47 are shown open in FIG. 3, the aluminum contact 62 also being a conforming open ring permitting aluminum contact 61, as shown by dotted line in FIG. 3, to extend from region 42 over the oxide layer through the open space in the open rings to a terminal point 67 elsewhere on the integrated circuit chip. If a flying wire were to substitute for this extended contact 61, the rings are preferably closed.

It is essential to provide the heavily doped guard ring 44 having N-type impurities in the epitaxial pocket 41 to attenuate injected currents into the P-body and the P+ isolation wall in the parasitic PNP transistor composed of regions 42, 41 and 50, respectively. A buried layer 46 heavily doped with N-type impurities is positioned at the interface between the P-body and the epitaxial pocket 41, for the same reason, and to overlap or coincide with the N-type guard ring 44 in the buried annular portion thereof so as to create a central region of the epitaxial pocket 41 completely surrounded within the silicon with heavily doped (N-type) material. Regions 46 and 44 make up this heavily N doped shield and are ohmically connected to the cathode contact 62. In an experimental unit not having the guard ring 44, the "floating" diode had formed therein a parasitic PNP transistor whose measured current gain $\beta$ was 0.4 while the "floating" diode of this invention with the ring 44 had a $\beta$ of 0.05.

With reference to FIG. 5, it is seen that when the input voltage is negative, i.e. terminal 101 is negative with respect to terminal 102, diode 1 is forward biased and in the conducting state. It is this forward biased condition for integrated circuit diodes, whose anodes are electrically connected to the P-body as the circuit ground reference point, that is found to present the unwanted situation wherein all of the epitaxial regions (e.g., 21) outside the epitaxial region (e.g., 11) in which the diode is formed (see FIG. 2) tend to become bipolar transistor collectors. In the "grounded" diodes 1 and 2 of this invention a single annular isolation region 21 is ohmically connected through the contact 33 to ground so that "collected" current merely parallels the normal forward current of the diode. The outer isolation wall 28 likewise is tied to ground. Thus, epitaxial regions outside the outer isolation wall are physically removed a relatively large distance from the negatively polarized epitaxial region 11, acting as the emitter, and current collected by the remote epitaxial regions is greatly attenuated by the high resistivity and long physical distance path through the P-body material acting as the base. The "grounded" diodes of this invention are so constructed that little current bypasses the conducting of said "grounded" diodes from the load, that in FIG. 5 would be connected across terminals 104 and 103.

An integrated full wave bridge was made using the more conventional "grounded" diode structure; that is, the diode of FIGS. 1 and 2 was made without grounded outer isolation wall 28 and without an electrically grounded adjacent annular epitaxial region such as 21. The parasitic transistor had a measured $\beta$ that was significantly greater than unity and in operation very large parasitic transistor currents caused thermal destruction of the metal (aluminum) contacts. On the other hand, the "grounded" diode prototype of this invention had a parasitic transistor with a $\beta$ of about 0.05.

It will be understood that in the integrated circuit bridge of this invention, portions of the isolation walls 50 of "floating" diodes 3 and 4 as well as portions of the outer isolation walls 28 of "grounded" diodes 1 and 2 may be commonly shared between adjacent diodes. Isolation walls 28 and 50 are electrically connected in common to circuit ground point G, and conductor 64 of FIG. 4 may be an extended portion of the aluminum film conductor by which conductor 37 of FIG. 2 is made. In the diagram of electrical connections shown in FIG. 4, conductor 35 connects the cathode contact 31 to terminal 36, that corresponds to full wave bridge circuit point X as seen in FIG. 5.

FIGS. 1 and 3 are drawn essentially to scale relative to prototype integrated diodes that were made in accordance with the principles of this invention. The outer isolation walls 28 of the "grounded" diodes are about 40 microns square while the isolation walls 50 of the "floating" diodes are about 30 microns square. The vertical dimensions in FIGS. 2 and 4 are exaggerated for clarity. The epitaxial layer of the prototype was about 14 microns in thickness. With an a.c. voltage of 80 volts peak to peak applied to the input of the bridge, about 40 volts (peak) d.c. appeared at the bridge output terminals with a 50 milliampere average load current being drawn. Under these conditions approximately 10% more input current was drawn than for an ideal diode full wave bridge.

Although the bridge circuit of the preferred embodiment is shown formed in a P-type body, it is to be understood that a change of all the dopants to the opposite conductivity type provides a bridge circuit of this invention in an N-type body.

What is claimed is:

1. In an integrated circuit formed in a silicon body of P-type having grown on a surface thereof an epitaxial layer of N-type and an oxide layer having been grown over said layer, a full wave junction-diode bridge rectifier, that includes two diodes of a first kind having their anodes connected to a circuit ground terminal and two diodes of a second kind having cathodes connected to a +d.c. output terminal, each of said diodes being formed in a separate part of said epitaxial layer, each of said first kind diodes comprising: (1) first and second annular concentric isolation walls of P-type; (2) a heavily doped guard ring of N-type concentrically located between said first and second walls; (3) ohmic contacts being made to said walls and said guard ring and being electrically connected together to serve as an anode terminal; and (4) another ohmic contact being made to the portion of said epitaxial layer that is within the innermost of said walls to serve as a cathode terminal;

each of said second kind diodes comprising: (a) a third annular isolation wall of P-type; (b) a second heavily doped guard ring of N-type lying within and essentially concentric with said third wall; (c) a heavily doped buried layer of N-type lying in contact with a buried annular portion of said second guard ring; (d) a heavily doped anode region of P-type lying in the portion of said epitaxial layer that is enclosed within said second guard ring; (e) an ohmic contact being made to said guard ring to serve as a cathode terminal; (f) a shallow annular region of P-type that is within and essentially concentric with said second guard ring, said shallow annular region of P-type being open and having an open space therein, and having an ohmic connection to said guard ring; (g) a shallow heavily doped N-type region being spaced from but closely adjacent to said anode region, said shallow N+ region having an ohmic connection to said cathode terminal; (h) an ohmic contact being made to said anode region and extending over said oxide layer above said open space; and (i) an ohmic contact being made to said third wall being connected to said ground terminal.

2. The full wave bridge rectifier of claim 1 wherein said anode of each of said diodes of said second kind is interconnected to said cathode of one of said diodes of said first kind, so that when an a.c. voltage is applied between said interconnections a full wave rectified d.c. voltage appears between said d.c. output terminal and said ground terminal.

3. The full wave bridge rectifier of claim 1 wherein each of said first kind diodes additionally comprises a shallow region of P-type lying within and abutting said innermost isolation wall, said shallow P-type region having an ohmic connection to said innermost isolation wall.

* * * * *